United States Patent
Schellhammer

(10) Patent No.: US 11,227,972 B2
(45) Date of Patent: Jan. 18, 2022

(54) SOLID STATE LIGHTING DEVICES WITH DIELECTRIC INSULATION AND METHODS OF MANUFACTURING

(71) Applicant: Micron Technology, Inc., Boise, ID (US)

(72) Inventor: Scott D. Schellhammer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/553,720

(22) Filed: Aug. 28, 2019

(65) Prior Publication Data
US 2020/0013922 A1 Jan. 9, 2020

Related U.S. Application Data

(60) Continuation of application No. 15/910,460, filed on Mar. 2, 2018, now Pat. No. 10,439,102, which is a division of application No. 15/069,262, filed on Mar. 14, 2016, now Pat. No. 9,935,237, which is a division of application No. 12/853,014, filed on Aug. 9, 2010, now Pat. No. 9,287,452.

(51) Int. Cl.
*H01L 33/02* (2010.01)
*H01L 33/24* (2010.01)
*H01L 33/00* (2010.01)
*H01L 33/06* (2010.01)
*H01L 33/32* (2010.01)

(52) U.S. Cl.
CPC ........ *H01L 33/025* (2013.01); *H01L 33/0095* (2013.01); *H01L 33/06* (2013.01); *H01L 33/24* (2013.01); *H01L 33/32* (2013.01)

(58) Field of Classification Search
CPC ... H01L 33/025; H01L 33/0095; H01L 33/06; H01L 33/24; H01L 33/32
See application file for complete search history.

(56) References Cited

U.S. PATENT DOCUMENTS 5,701,280 A 12/1997 Miyashita
5,708,280 A 1/1998 Lebby et al.
(Continued)

FOREIGN PATENT DOCUMENTS

WO 2009093792 A1 7/2009

OTHER PUBLICATIONS

Oh et al., "Improvement of green LED by growing p-GaN on In0.25GaN MQWs at low temperature", Journal of Crystal Growth 289 (2006) 107-112, 2005 Elsevier B.V.
(Continued)

*Primary Examiner* — Sitaramarao S Yechuri
(74) *Attorney, Agent, or Firm* — Perkins Coie LLP

(57) ABSTRACT

Solid state lighting devices and associated methods of manufacturing are disclosed herein. In one embodiment, a solid state lighting device includes a first semiconductor material, a second semiconductor material spaced apart from the first semiconductor material, and an active region between the first and second semiconductor materials. The solid state lighting device also includes an indentation extending from the second semiconductor material toward the active region and the first semiconductor material and an insulating material in the indentation of the solid state lighting structure.

12 Claims, 5 Drawing Sheets

(56) References Cited

U.S. PATENT DOCUMENTS

| | | | |
|---|---|---|---|
| 6,246,105 | B1 | 6/2001 | Morozumi et al. |
| 6,329,667 | B1 | 12/2001 | Ota et al. |
| 7,732,306 | B2 | 6/2010 | Arena et al. |
| 8,507,302 | B1 | 8/2013 | Chu et al. |
| 9,935,237 | B2 | 4/2018 | Schellhammer |
| 2004/0048441 | A1* | 3/2004 | Akatsu ............... H01L 27/1087 438/386 |
| 2004/0130002 | A1 | 7/2004 | Weeks et al. |
| 2005/0029531 | A1 | 2/2005 | Nakayama et al. |
| 2005/0067624 | A1* | 3/2005 | Steigerwald ............ H01L 33/08 257/79 |
| 2006/0002442 | A1 | 1/2006 | Haberern et al. |
| 2006/0208273 | A1 | 9/2006 | Kang |
| 2006/0246612 | A1 | 11/2006 | Emerson et al. |
| 2007/0057249 | A1 | 3/2007 | Kim et al. |
| 2007/0138505 | A1 | 6/2007 | Preble et al. |
| 2007/0259504 | A1 | 11/2007 | Bour et al. |
| 2007/0284598 | A1* | 12/2007 | Shakuda ............... H01L 27/156 257/93 |
| 2007/0295981 | A1* | 12/2007 | Erchak .................. H01L 33/20 257/98 |
| 2008/0211416 | A1* | 9/2008 | Negley ............... H01L 25/0756 315/193 |
| 2008/0230792 | A1 | 9/2008 | Jiang et al. |
| 2008/0237620 | A1 | 10/2008 | Shiue et al. |
| 2009/0098413 | A1 | 4/2009 | Kanegae |
| 2010/0032704 | A1 | 2/2010 | Denbaars et al. |
| 2010/0059779 | A1 | 3/2010 | Chen et al. |
| 2010/0109022 | A1 | 5/2010 | Kim et al. |
| 2010/0133548 | A1 | 6/2010 | Arena et al. |
| 2010/0213481 | A1* | 8/2010 | Hwang ................. H01L 33/145 257/98 |
| 2010/0265981 | A1 | 10/2010 | Hiroyama et al. |
| 2010/0283035 | A1 | 11/2010 | Tanaka |
| 2010/0289041 | A1 | 11/2010 | Shakuda et al. |
| 2011/0014734 | A1* | 1/2011 | Lu ......................... H01L 33/44 438/29 |
| 2011/0266568 | A1 | 11/2011 | Aldaz et al. |
| 2018/0190862 | A1 | 7/2018 | Schellhammer |

OTHER PUBLICATIONS

Sharma et al., "Chemical mapping of InGaN MQWs", Journal of Crystal Growth 230 (2001) 438-441, 2001 Elsevier Science B.V.

* cited by examiner

SOLID STATE LIGHTING DEVICES WITH DIELECTRIC INSULATION AND METHODS OF MANUFACTURING

CROSS-REFERENCE TO RELATED APPLICATIONS

This application is a continuation of U.S. application Ser. No. 15/910,460, filed Mar. 2, 2018, now U.S. Pat. No. 10,439,102; which is a divisional of U.S. application Ser. No. 15/069,262, filed Mar. 14, 2016, now U.S. Pat. No. 9,935,237; which is a divisional of U.S. patent application Ser. No. 12/853,014, filed Aug. 9, 2010, now U.S. Pat. No. 9,287,452; each of which is incorporated herein by reference in its entirety.

TECHNICAL FIELD

The present technology is directed generally to solid state lighting ("SSL") devices with dielectric insulation and associated methods of manufacturing.

BACKGROUND

SSL devices generally use semiconductor light emitting diodes ("LEDs"), organic light emitting diodes ("OLEDs"), laser diodes ("LDs"), and/or polymer light emitting diodes ("PLEDs") as sources of illumination rather than electrical filaments, a plasma, or a gas. FIG. 1 is a cross-sectional diagram of a portion of a conventional indium gallium nitride ("InGaN") LED 10. As shown in FIG. 1, the LED 10 includes a substrate material 12 (e.g., silicon carbide, sapphire, or silicon), an N-type gallium nitride ("GaN") material 14, an active region 16 (e.g., GaN/InGaN multiple quantum wells ("MQWs")), and a P-type GaN material 18 on top of one another in series. The LED 10 can also include a first contact 11 on the P-type GaN material 18 and a second contact 15 on the N-type GaN material 14.

The GaN/InGaN materials 14, 16, and 18 of the LED 10 are generally formed via epitaxial growth. The formed GaN/InGaN materials 14, 16, and 18, however, typically include a high density of lattice dislocations that can negatively impact the optical and/or electrical performance of the LED 10. For example, as described in more detail later, the formed GaN/InGaN materials 14, 16, and 18 can include a plurality of indentations that may form unintended carrier passages bypassing the active region 16 during processing.

One conventional technique for addressing the high density of lattice dislocations is to incorporate aluminum nitride (AlN), silicon nitride (SiN), and/or other suitable interlayers in the LED 10 (e.g., between the substrate 12 and the N-type gallium nitride 14). The incorporation of such interlayers, however, cannot completely eliminate the lattice dislocations in the GaN/InGaN materials 14, 16, and 18 of the LED 10. Also, incorporating interlayers adds cost and time to the manufacturing process of the LED 10. Accordingly, several improvements to at least lessen the impact of the lattice dislocations in LEDs may be desirable.

DETAILED DESCRIPTION

Various embodiments of SSL devices with dielectric insulation and associated methods of manufacturing are described below. The term "microelectronic substrate" is used throughout to include substrates upon which and/or in which SSL devices, microelectronic devices, micromechanical devices, data storage elements, read/write components, and other features are fabricated. The term "lattice dislocation" generally refers to a crystallographic defect or irregularity within a crystal structure. A lattice dislocation can include a V-defect, an edge dislocation, a threading (or screw) dislocation, and/or a combination thereof. A person skilled in the relevant art will also understand that the technology may have additional embodiments, and that the technology may be practiced without several of the details of the embodiments described below with reference to FIGS. 2A and 2C-3F.

FIGS. 2A and 2C-2F are cross-sectional views of a portion of a microelectronic substrate 100 undergoing a process for forming an SSL device in accordance with embodiments of the technology. The SSL device can be an LED, an OLED, a LD, a PLED, and/or other suitable devices. In the following description, common acts and structures are identified by the same reference numbers. Even though only particular processing operations and associated structures are illustrated in FIGS. 2A and 2C-2F, in certain embodiments, the process can also include forming a lens, a mirror material, support structures, conductive interconnects, and/or other suitable mechanical/electrical components (not shown).

Figure 1:
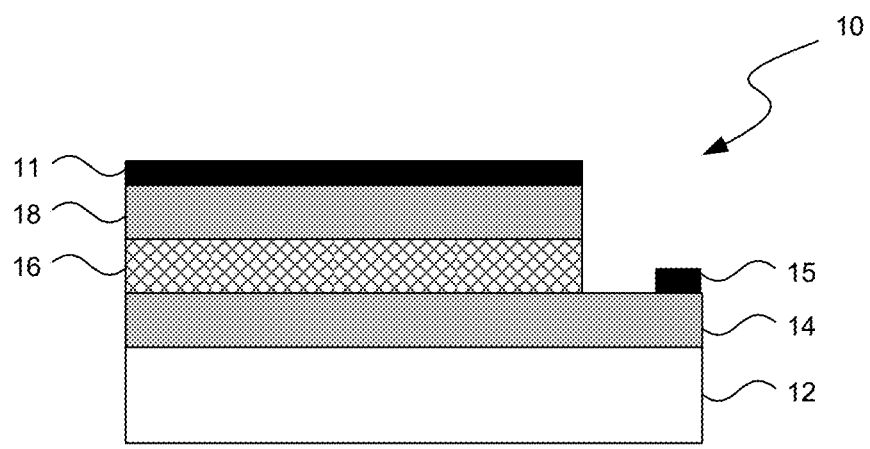
FIG. 1 is a cross-sectional view of a portion of an LED in accordance with the prior art.
Figure 2A:
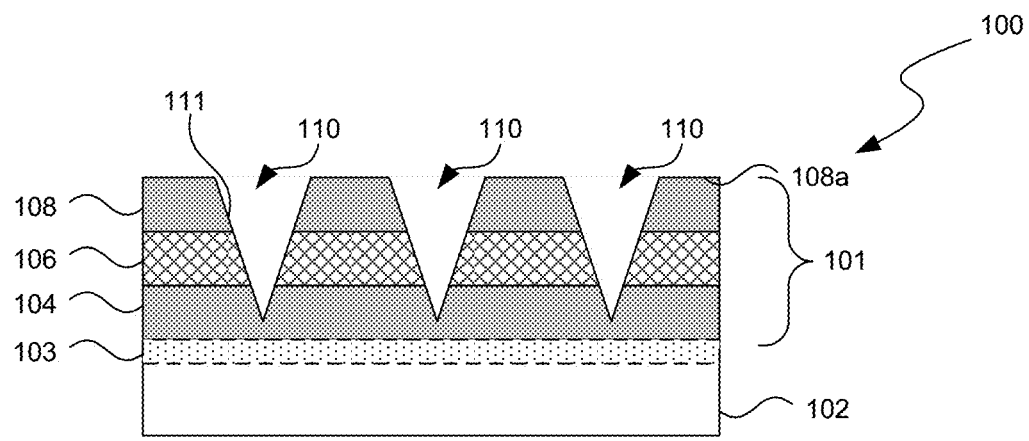
FIG. 2A is a cross-sectional view of a portion of a microelectronic substrate undergoing a process for forming an SSL device in accordance with embodiments of the technology.

As shown in FIG. 2A, an initial operation of the process can include forming an SSL structure 101 and an optional buffer material 103 on a substrate material 102. The substrate material 102 can include a silicon (Si) wafer (e.g., with a Si(1,1,1) crystal orientation), aluminum gallium nitride (AlGaN), GaN, silicon carbide (SiC), sapphire (Al$_2$O$_3$), a combination of the foregoing materials, and/or other suitable substrate materials. In certain embodiments, the optional buffer material 103 can include AN, GaN, zinc nitride (ZnN), and/or other suitable materials. In other embodiments, the optional buffer material 103 may be omitted, and the SSL structure 101 may be formed directly on the substrate material 102.

The SSL structure 101 can include a first semiconductor material 104, an active region 106, and a second semiconductor material 108 stacked one on the other. In one embodiment, the first and second semiconductor materials 104 and 108 include an N-type GaN material and a P-type GaN material, respectively. In another embodiment, the first and second semiconductor materials 104 and 108 include a P-type GaN material and an N-type GaN material, respectively. In further embodiments, the first and second semiconductor materials 104 and 108 can individually include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, InGaN/GaN MQWs, and/or an InGaN bulk material. In other embodiments, the active region 116 can include aluminum gallium indium phosphide (AlGaInP), aluminum gallium indium nitride (AlGaInN), and/or other suitable materials or configurations.

The SSL structure 101 and the optional buffer material 103 can be formed on the substrate material 102 via MOCVD, molecular beam epitaxy ("MBE"), liquid phase epitaxy ("LPE"), hydride vapor phase epitaxy ("HVPE"), and/or other suitable epitaxial growth techniques. It has been observed, however, that the SSL structure 101 formed via the foregoing techniques typically includes a high density of lattice dislocations. For example, as shown in FIG. 2A, the SSL structure 101 can include a plurality of indentations 110 in the SSL structure 101. Three indentations 110 are shown in FIG. 2A for illustration purposes, and the dimensions of the indentations 110 are exaggerated for clarity.

As shown in FIG. 2A, the indentations 110 can include a plurality of sidewalls 111 extending into the SSL structure 101. In the illustrated embodiment, the indentations 110 individually include sidewalls 111 extending from a surface 108a of the second semiconductor material 108 into the active region 106 and the first semiconductor material 104. In other embodiments, at least some of the indentations 110 can include sidewalls that extend only into the active region 106, or the indentations can extend into the optional buffer material 103 or even into the substrate material 102. In any of the foregoing embodiments, the SSL structure 101 can also include edge dislocations, threading dislocations, and/or other lattice dislocations (not shown).

Without being bound by theory, it is believed that various structural and/or operational conditions may cause the formation of the indentations 110 during processing. For example, it is believed that indentations 110 may form due to different crystal growth rates along different crystal facets of the substrate material 102 (or the optional buffer material 103). It has been observed that epitaxial growth along certain crystal facets (e.g., c-plane) results in lower surface energy than other crystal facets (e.g., m-plane). As a result, epitaxial growth may propagate along certain crystal facets faster than others to form the indentations 110. It is also believed that contaminant particles on the surface of the substrate material 102 and/or other epitaxial growth conditions may also cause the indentations 110 to form.

Figure 2B:
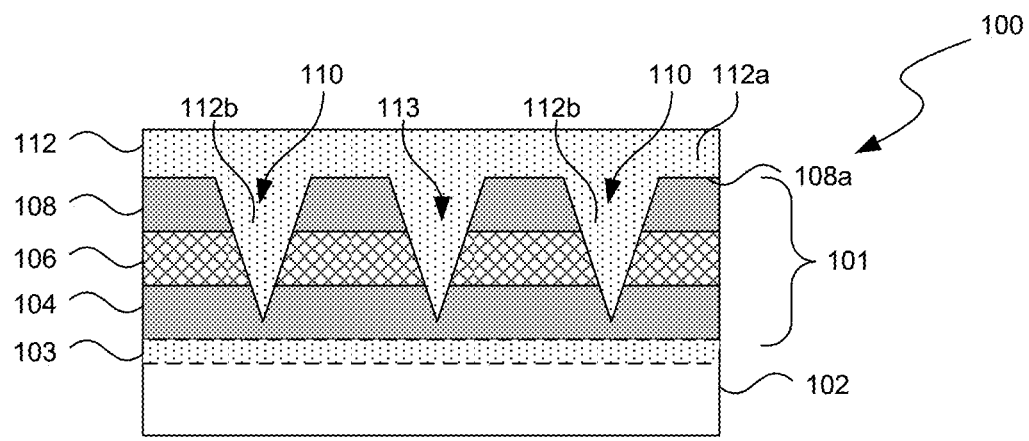
FIG. 2B is a cross-sectional view of a portion of a microelectronic substrate undergoing a process for forming an SSL device in accordance with conventional techniques.

The indentations 110 can cause low optical efficiencies of the SSL structure 101 when the microelectronic substrate 100 is processed in accordance with conventional techniques. For example, as shown in FIG. 2B, a conductive material 112 (e.g., silver) is formed on the second semiconductor material 108 as an electrical contact in accordance with conventional techniques. The conductive material 112 includes a first portion 112a on the surface 108a of the second semiconductor material 108 and a second portion 112b in contact with the first semiconductor material 104. Thus, the second portion 112b of the conductive material 112 forms carrier passages 113 electrically connecting the first and second semiconductor materials 104 and 108. As a result, charge carriers (i.e., holes and electrons) from the first and second semiconductor materials 104 and 108 may bypass the active region 106 and combine non-radiatively in the carrier passages 113. Such non-radiative recombination can thus cause low optical efficiencies in the SSL structure 101.

Figure 2C:
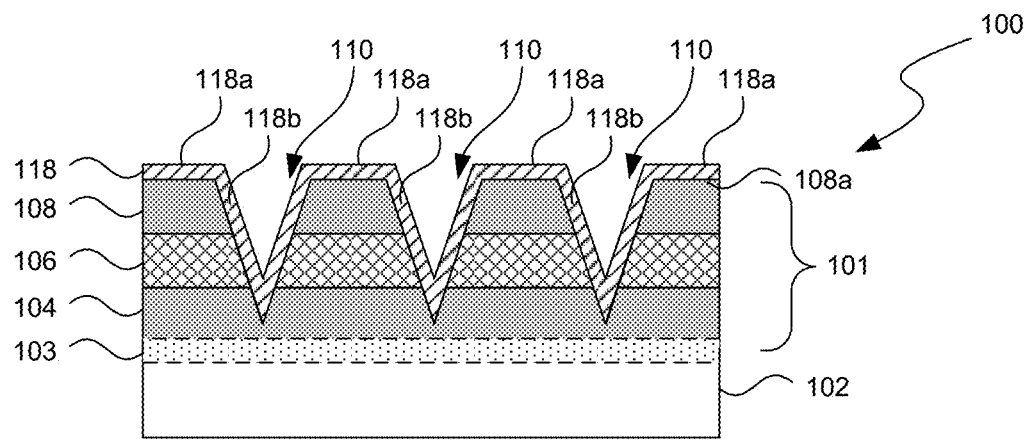
FIGS. 2C-2F are cross-sectional views of a portion of a microelectronic substrate undergoing a process for forming an SSL device in accordance with embodiments of the technology.

Several embodiments of the process can at least reduce or eliminate the risk of forming bypassing carrier passages 113 by incorporating an insulation material in the SSL structure 101. As shown in FIG. 2C, another operation of the process includes depositing an insulating material 118 on the SSL structure 101. The insulating material 118 can include a first insulating portion 118a on the surface 108a of the second semiconductor material 108 and a second insulating portion 118b in the indentations 110. In the illustrated embodiment, the insulating material 118 generally conforms to the surface 108a and the sidewalls 111 of the indentations 110. In other embodiments, the insulating material 118 can partially or substantially fill the indentations 110, as described in more detail later with reference to FIG. 2F.

The insulating material 118 can include silicon dioxide ($SiO_2$), silicon nitride (SiN), hafnium silicate ($HfSiO_4$), zirconium silicate ($ZrSiO_4$), hafnium dioxide ($HfO_2$), zirconium dioxide ($ZrO_2$), aluminum oxide ($Al_2O_3$), and/or other suitable materials with a dielectric constant higher than about 1.0 at 20° C. under 1 kHz. Techniques for forming the insulating material 118 can include chemical vapor deposition ("CVD"), atomic layer deposition ("ALD"), spin-on coating, thermal oxidation, and/or other suitable techniques.

Figure 2D:
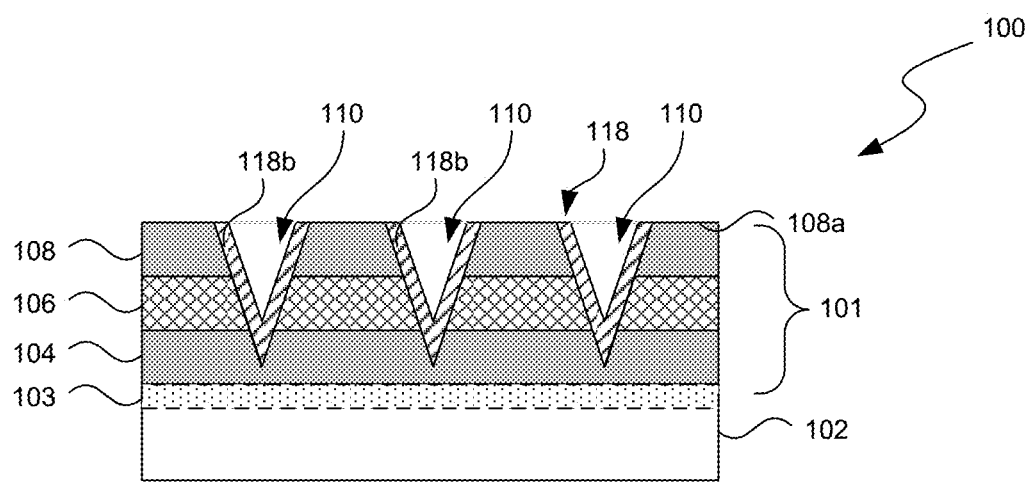

FIG. 2D shows another operation of the process, in which the first insulating portion 118a (FIG. 2C) of the insulating material 118 is removed from the SSL structure 101 while the second insulating portion 118b remains in the indentations 110. As a result, the insulating material 118 does not cover the surface 108a of the second semiconductor material 108. In one embodiment, removal of the first insulating portion 118a is stopped when the surface 108a of the second semiconductor material 108 is exposed. In other embodiments, at least a portion of the second semiconductor material 108 may be removed beyond the surface 108a. Techniques for removing the first insulating portion 118a of the insulating material 118 include chemical-mechanical polishing ("CMP"), electro-chemical-mechanical polishing ("ECMP"), wet etching, drying etching, laser ablation, and/or other suitable material removal techniques.

Figure 2E:
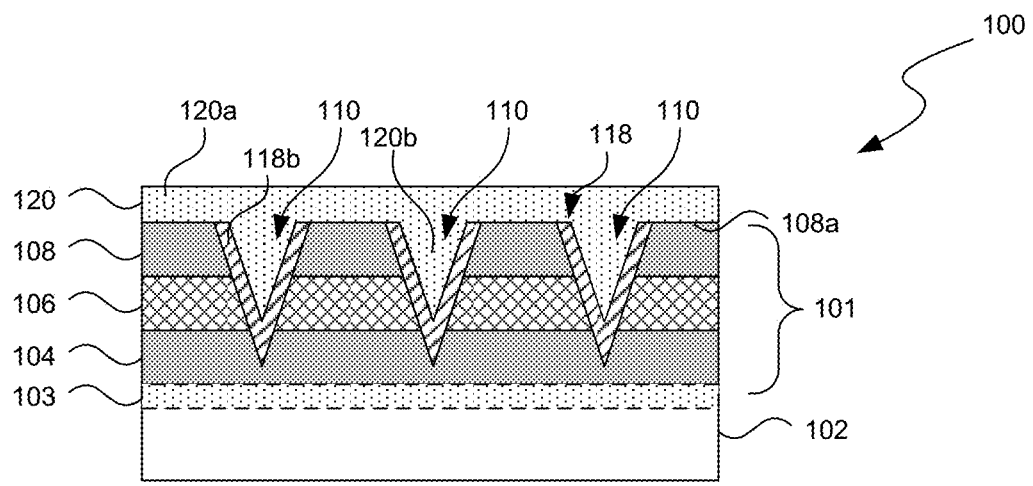

FIG. 2E shows a subsequent operation of the process, in which a conductive material 120 is formed on the SSL structure 101 with the insulating material 118. As shown in FIG. 2E, the conductive material 120 includes a first conductive portion 120a and a second conductive portion 120b. The first conductive portion 120a is in contact with the surface 108a of the second semiconductor material 108 forming an electrical contact for the SSL structure 101. The second conductive portion 120b is within the indentations 110 and in contact with the second insulating portion 118b.

In certain embodiments, the conductive material 120 can include indium tin oxide ("ITO"), aluminum zinc oxide ("AZO"), fluorine-doped tin oxide ("FTO"), and/or other suitable transparent conductive oxide ("TCOs"). In other embodiments, the conductive material 120 can include copper (Cu), aluminum (Al), silver (Ag), gold (Au), platinum (Pt), and/or other suitable metals. In further embodiments, the conductive material 120 can include a combination of TCOs and one or more metals. Techniques for forming the conductive material 120 can include MOCVD, MBT, spray pyrolysis, pulsed laser deposition, sputtering, electroplating, and/or other suitable deposition techniques.

The SSL device formed in accordance with several embodiments of the foregoing process can have improved optical efficiencies over conventional devices by eliminating bypassing carrier passages 113 (FIG. 2B). For example, as shown in FIG. 2E, the second insulating portion 118b electrically insulates the second conductive portion 120b from the active region 106 and the first semiconductor material 104. The second insulating portion 118b can thus prevent the second conductive portion 120b from forming carrier passages that would otherwise bypass the active region 106 by directly connecting the first and second semiconductor materials 104 and 108. As a result, non-radiative recombination of charge carriers (i.e., holes and electrons) in bypassing carrier passages can be at least reduced or generally eliminated in the SSL structure 101.

Figure 2F:
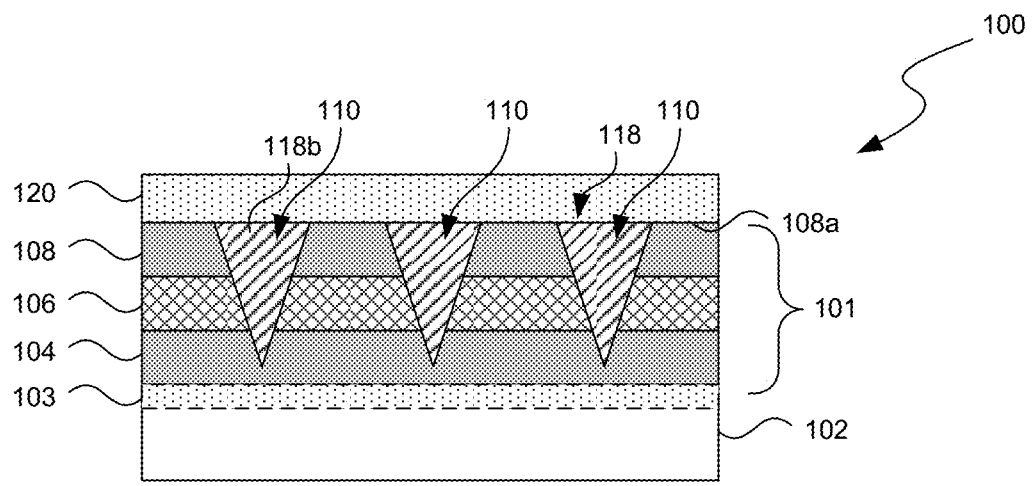

Even though the insulating material 118 is shown as generally conformal to the SSL structure 101 in FIGS. 2C-2E, in certain embodiments, the insulating material 118 can also have other configurations. For example, as shown in FIG. 2F, the second portion 118b of the insulating material 118 can substantially or completely fill the indentations 110, the second portion 118b of the insulating material 118 can even extend beyond the surface 108a of the second semiconductor material 108. Subsequently, portions of the insulating material 118 that extend beyond the surface 108a may be removed via CMP, ECMP, and/or other suitable techniques. Thus, the second insulating portion 118b can be generally coplanar with the surface 108a of the second semiconductor material 108. In other examples, the insulating material 118 can partially fill the indentations 110 and/or have other suitable configurations. In further examples, the insulating material 118 may be formed before forming the second semiconductor material 108, as described in more detail below with reference to FIGS. 3A-3E.

Figure 3A:
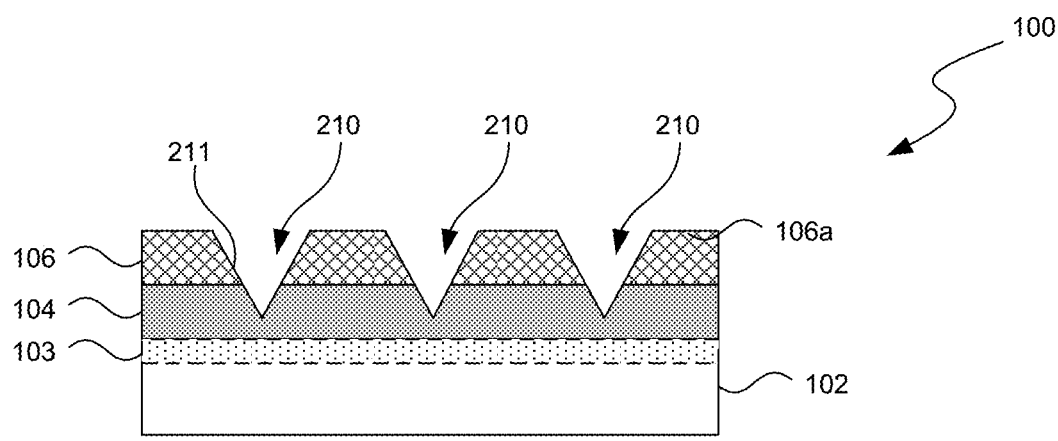
FIGS. 3A-3F are cross-sectional views of a portion of a microelectronic substrate undergoing another process for forming an SSL device in accordance with additional embodiments of the technology.

FIGS. 3A-3E are cross-sectional views of a portion of a microelectronic substrate 100 undergoing another process for forming an SSL device in accordance with additional embodiments of the technology. As shown in FIG. 3A, an initial operation of the process can include forming a first semiconductor material 104 and an active region 106 on a substrate material 102 (with an optional buffer material 103) via MOCVD, MBE, LPE, HVPE, and/or other suitable epitaxial growth techniques. The active region 106 has a surface 106a facing away from the first semiconductor material 104.

As described above with reference to FIG. 2A, it is believed that various structural and/or operational conditions may cause the formation of indentations 210 (three are shown for illustration purposes) during epitaxial growth, as shown in FIG. 3A. In the illustrated embodiment, the indentations 210 have a plurality of sidewalls 211 extending from the surface 106a of the active region 106 into the first semiconductor material 104. In other embodiments, at least some of the indentations 210 can also have sidewalls extending into the optional buffer material 103 and/or the substrate material 102.

Figure 3B:
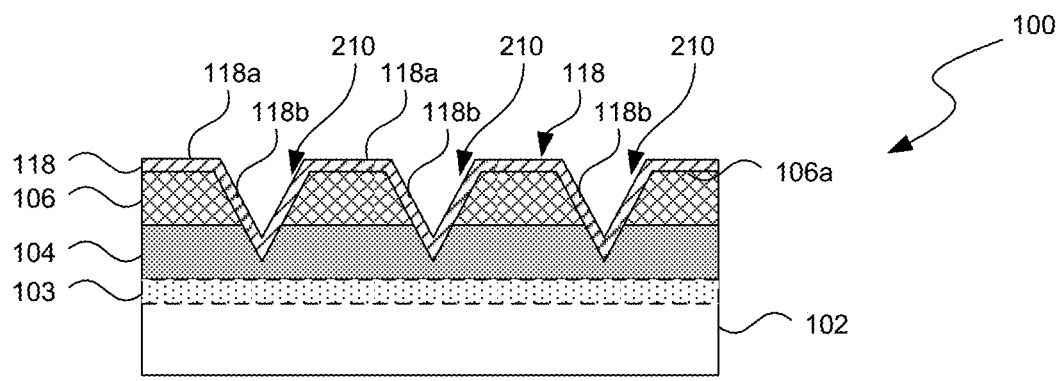
Figure 3C:
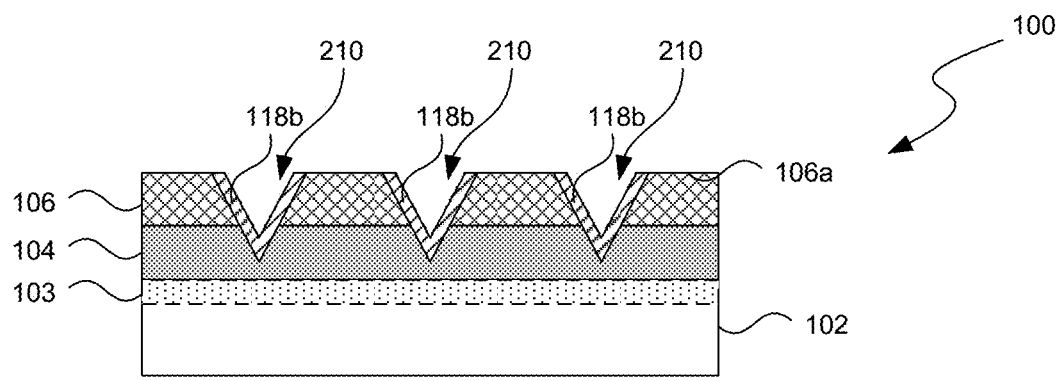

As shown in FIG. 3B, another operation of the process includes depositing the insulating material 118 on the microelectronic substrate 100 such that the first insulating portion 118a is on the surface 106a of the active region 106 and the second insulating portion 118b is in the indentations 210. As shown in FIG. 3C, the process can further include removing the first insulating portion 118a (FIG. 3B) of the insulating material 118 from the microelectronic substrate 100 in a fashion generally similar to that described above with reference to FIG. 2D. The material removal operation may be stopped when the surface 106a of the active region 106 is exposed while the second insulating portion 118b remains in the indentations 210.

Figure 3D:
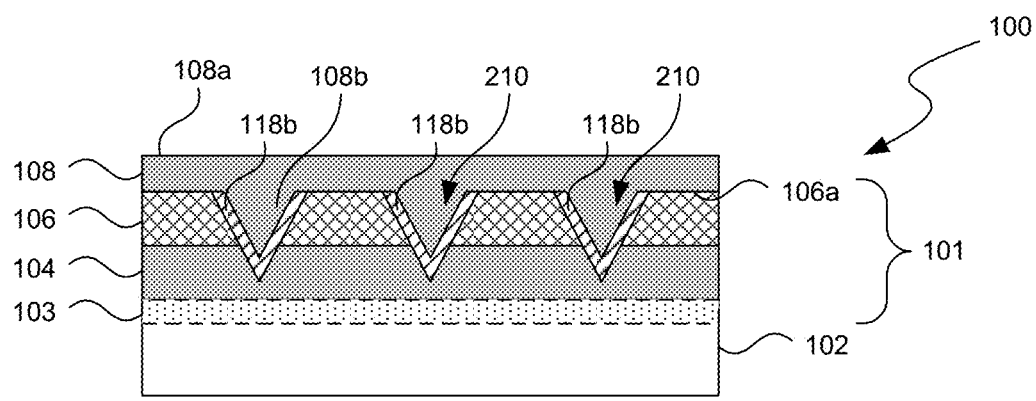

As shown in FIG. 3D, a subsequent operation of the process includes forming the second semiconductor material 108 on the microelectronic substrate 100 via MOCVD, MBE, LPE, HVPE, and/or other suitable epitaxial growth techniques. The first semiconductor material 104, the active region 106, and the second semiconductor material 108 form a different embodiment of the SSL structure 101. In one embodiment, the second semiconductor material 108 may grow into the indentations 210 via a combination of lateral and vertical growth. Thus, the second semiconductor material 108 includes a first semiconductor portion 108a on the surface 106a of the active region 106 and a second semiconductor portion 108b in the indentations 210. In other embodiments, the indentations 210 may be filled with a filler material (e.g., AN, not shown) before the second semiconductor material 108 is formed. In further embodiments, the second semiconductor material 108 may have other suitable configurations. In any of the foregoing embodiments, the second insulating portion 118b of the insulating material 118 electrically insulates the second semiconductor material 108 from the first semiconductor material 104 and the active region 106.

Figure 3E:
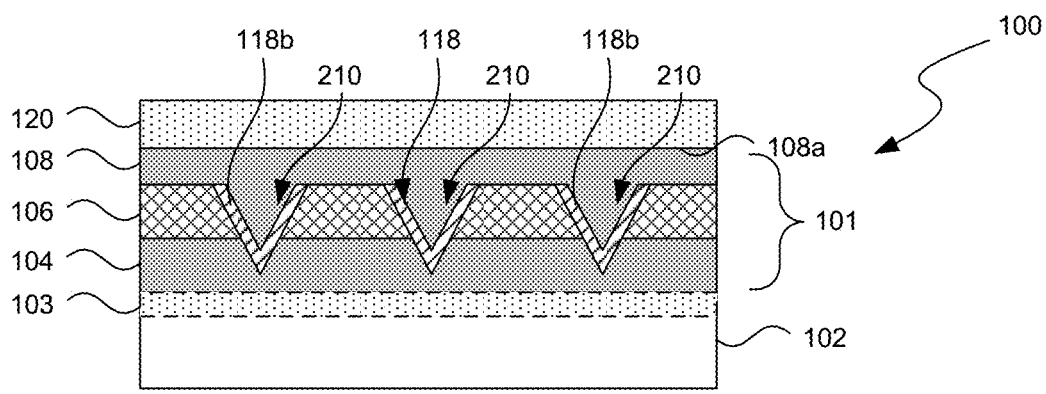

In the illustrated embodiment, the second semiconductor material 108 has a generally planar surface 108a facing away from the active region 106. As shown in FIG. 3E, another operation of the process can include forming a conductive material 120 on the generally planar surface 108a for electrical connection to the second semiconductor material 108. In other embodiments, the second semiconductor material 108 can also have a non-planar surface (not shown) and/or have other suitable structural configurations.

Figure 3F:
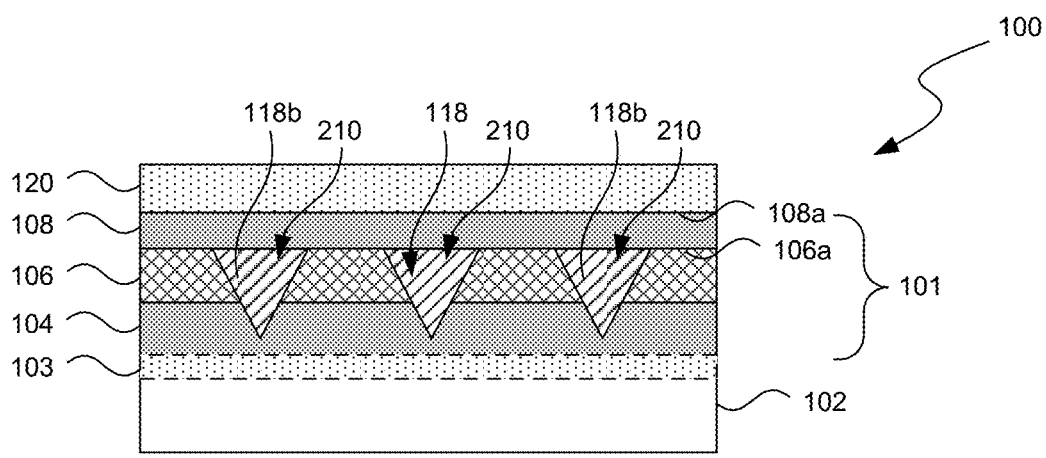

FIG. 3F shows another embodiment of the process in which the second insulating portion 118b of the insulating material 118 can substantially fill the indentations 210, which can be generally similar to the operation described above with reference to FIG. 2E. In the illustrated embodiment, the insulating material 118 is generally coplanar with the surface 106a of the active region 106. In other embodiments, the insulating material 118 can be non-planar with the surface 106a and/or have other suitable configurations.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

I claim:

1. A method for forming a solid state lighting device, comprising:
   forming a solid state lighting structure on a substrate material, the solid state lighting structure having:
   a first semiconductor material remaining over the substrate material after formation of the solid state lighting device;
   a second semiconductor material over and spaced apart from the first semiconductor material, wherein the second semiconductor material has a surface facing away from the active region;
   an active region between the first and second semiconductor materials; and an indentation having sidewalls extending at least partially through the second semiconductor material and at most partially into the first semiconductor material, wherein the sidewalls are surrounded by at least one of the second semiconductor material and the active region, wherein the indentation has the sidewalls extending from the surface of the second semiconductor material into the active region;

disposing a conductive material on the second semiconductor material; and electrically insulating, via an insulating material, the conductive material from at least one of the active region and the first semiconductor material, wherein the conductive material includes (a) a first conductive portion over the second semiconductor material and (b) a second conductive portion between the sidewalls of the indentation and below an upper surface of the insulating material, wherein electrically insulating the conductive material includes:

depositing an insulating material on the solid state lighting structure, the insulating material including a first insulating portion on the surface of the second semiconductor material and a second insulating portion in the indentation; and removing the first insulating portion of the insulating material from the surface of the second semiconductor material, the second insulating portion remaining in the indentation; and wherein depositing the conductive material includes forming an electrical contact by depositing the conductive material on the surface of the second semiconductor material and the second insulating portion of the insulating material.

2. The method of claim 1 wherein:
the second semiconductor material has a surface facing away from the active region; and
the sidewalls extend from the surface of the second semiconductor material into the active region; and
electrically insulating the conductive material includes interposing the insulating material between the conductive material and the active region and between the conductive material and the first semiconductor material.

3. The method of claim 1 wherein:
electrically insulating the conductive material includes depositing the insulating material in the indentation prior to disposing the conductive material.

4. The method of claim 1 wherein:
electrically insulating the conductive material includes at least partially filling the indentation with the insulating material prior to disposing the conductive material.

5. The method of claim 1 wherein the indentation is a V-shaped indentation.

6. The method of claim 1 wherein the sidewalls of the indentation converge toward one another as they extend toward the first semiconductor material.

7. The method of claim 1 wherein electrically insulating the conductive material includes depositing the insulating material in the indentation and generally conforming to the sidewalls of the indentation.

8. The method of claim 1 wherein electrically insulating the conductive material includes at least partially filling the indentation with the insulating material.

9. A method for forming a solid state lighting device, comprising:
forming a solid state lighting structure on a substrate material, the solid state lighting structure having:
a first semiconductor material remaining over the substrate material after formation of the solid state lighting device;
a second semiconductor material over and spaced apart from the first semiconductor material, wherein the second semiconductor material has a surface facing away from the active region; and
an active region between the first and second semiconductor materials; and
an indentation having sidewalls extending at least partially through the second semiconductor material and at most partially into the first semiconductor material, wherein the sidewalls are surrounded by at least one of the second semiconductor material and the active region, wherein the indentation has the sidewalls extending from the surface of the second semiconductor material into the active region;

disposing a conductive material on the second semiconductor material;

electrically insulating, via an insulating material, the conductive material from at least one of the active region and the first semiconductor material, wherein the conductive material includes (a) a first conductive portion over the second semiconductor material and (b) a second conductive portion between the sidewalls of the indentation and below an upper surface of the insulating material, wherein electrically insulating the conductive material includes:

depositing the insulating material on the solid state lighting structure, the insulating material including a first insulating portion on the surface of the second semiconductor material and a second insulating portion in the indentation and generally conforming to the sidewalls of the indentation; and removing the first insulating portion of the insulating material from the surface of the second semiconductor material, the second insulating portion remaining in the indentation; and wherein depositing the conductive material includes forming an electrical contact by depositing the conductive material on the surface of the second semiconductor material and the second insulating portion of the insulating material.

10. A method of forming a solid state lighting device, comprising:
forming a solid state lighting structure on a substrate material, the solid state lighting structure having:
a first semiconductor material remaining over the substrate material after formation of the solid state lighting device;
a second semiconductor material over and spaced apart from the first semiconductor material, wherein the second semiconductor material has a surface facing away from the active region; and
an active region between the first and second semiconductor materials; and
an indentation having sidewalls extending at least partially through the second semiconductor material and at most partially into the first semiconductor material, wherein the sidewalls are surrounded by at least one of the second semiconductor material and the active region, wherein the indentation has the sidewalls extending from the surface of the second semiconductor material into the active region;

disposing a conductive material on the second semiconductor material;

electrically insulating, via an insulating material, the conductive material from at least one of the active region and the first semiconductor material, wherein the conductive material includes (a) a first conductive portion over the second semiconductor material and (b) a second conductive portion between the sidewalls of the indentation and below an upper surface of the insulating material, wherein electrically insulating the conductive material includes:
  depositing the insulating material on the solid state lighting structure, the insulating material including a first insulating portion on the surface of the second semiconductor material and a second insulating portion in the indentation; and
  removing the first insulating portion of the insulating material from the surface of the second semiconductor material, the second insulating portion remaining in the indentation; and
wherein depositing the conductive material includes forming an electrical contact by depositing the conductive material on the surface of the second semiconductor material and the second insulating portion of the insulating material.

11. A method for forming a solid state lighting device, comprising:
  forming a solid state lighting structure on a substrate material, the solid state lighting structure having:
    a first semiconductor material;
    a second semiconductor material spaced apart from the first semiconductor material;
    an active region between the first and second semiconductor materials; and
    an indentation having sidewalls extending at least partially through the second semiconductor material and the first semiconductor material, wherein the sidewalls are surrounded by at least one of the second semiconductor material and the active region;
  disposing a conductive material on the second semiconductor material; and
  electrically insulating, via an insulating material, the conductive material from at least one of the active region and the first semiconductor material, wherein the conductive material includes (a) a first conductive portion over the second semiconductor material and (b) a second conductive portion between the sidewalls of the indentation and below an upper surface of the insulating material;
  wherein:
  the active region has a surface facing away from the first semiconductor material; and
  the indentation has the sidewalls extending from the surface of the active region into the first semiconductor material; and
  forming a solid state lighting structure includes:
    depositing the insulating material on the solid state lighting structure, the insulating material including a first insulating portion on the surface of the active region and a second insulating portion in the indentation;
    removing the first insulating portion of the insulating material from the surface of the active region, the second insulating portion remaining in the indentation; and
    subsequently, forming the second semiconductor material on the active region and the second insulating portion of the insulating material.

12. A method for forming a solid state lighting device, comprising:
  forming a solid state lighting structure on a substrate material, the solid state lighting structure having:
    a first semiconductor material;
    a second semiconductor material spaced apart from the first semiconductor material;
    an active region between the first and second semiconductor materials; and
    an indentation having sidewalls extending at least partially through the second semiconductor material and the first semiconductor material, wherein the sidewalls are surrounded by at least one of the second semiconductor material and the active region;
  disposing a conductive material on the second semiconductor material, wherein the conductive material includes (1) a first conductive portion over the second semiconductor material and (2) a second conductive portion between the sidewalls of the indentation; and
  electrically insulating, via an insulating material, the conductive material from at least one of the active region and the first semiconductor material, wherein
    the second conductive portion is below an upper surface of the insulating material, and
    the insulating material includes a first insulating portion on a surface of the active region and a second insulating portion in the indentation; and
  removing the first insulating portion of the insulating material from the surface of the active region, the second insulating portion remaining in the indentation, wherein
  the second semiconductor material is subsequently formed on the active region and the second insulating portion of the insulating material.

* * * * *